United States Patent
Campbell et al.

(10) Patent No.: US 8,020,298 B2
(45) Date of Patent: Sep. 20, 2011

(54) METHOD OF FABRICATING A HEAT EXCHANGER WITH ANGLED SECONDARY FINS EXTENDING FROM PRIMARY FINS

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 12/246,545

(22) Filed: Oct. 7, 2008

(65) Prior Publication Data
US 2009/0025223 A1 Jan. 29, 2009

Related U.S. Application Data

(62) Division of application No. 11/458,696, filed on Jul. 20, 2006, now abandoned.

(51) Int. Cl.
*B21D 53/06* (2006.01)
*B23P 15/26* (2006.01)
(52) U.S. Cl. ........ 29/890.047; 29/890.03; 29/890.035; 29/890.045; 29/890.046; 165/151; 165/182
(58) Field of Classification Search .. 29/890.03–890.05; 165/151, 182, DIG. 503
See application file for complete search history.

(56) References Cited

U.S. PATENT DOCUMENTS
1,927,079 A 9/1933 Wentworth
1,942,432 A 1/1934 Kimball et al.
(Continued)

FOREIGN PATENT DOCUMENTS
JP 11-023177 A 1/1999

OTHER PUBLICATIONS

Office Action for U.S. Appl. No. 11/458,696 (U.S. Patent Publication No. 2008/0017360 A1), dated Apr. 4, 2008.

(Continued)

*Primary Examiner* — Rick K Chang
(74) *Attorney, Agent, or Firm* — Dennis Jung, Esq.; Kevin P. Radigan, Esq.; Heslin Rothenberg Farley & Mesiti, P.C.

(57) ABSTRACT

A method of fabricating a heat exchanger which includes: obtaining multiple coolant-carrying conduit sections, each having a non-circular cross-section, and first and second main surfaces; providing multiple primary folded fins secured to the conduit sections. Each folded fin includes a solid fin surface with multiple bends defining alternating, U-shaped air-passage channels, and a base surface and a top surface. Each folded fin is secured at the base or top surface to a main surface of a conduit section, and the folded fins have leading and trailing edges relative to airflow direction. The method includes forming a plurality of sets of secondary fins, each set extending from the leading or trailing edge of a respective folded fin at an angle other than 0. At least one conduit section has a first folded fin secured to its first main surface, and a second folded fin secured to its second main surface thereof.

20 Claims, 12 Drawing Sheets

U.S. PATENT DOCUMENTS

| | | |
|---|---|---|
| 2,252,211 A | 8/1941 | Seemiller |
| 3,490,524 A | 1/1970 | Pasternak |
| 3,516,483 A | 6/1970 | Benteler et al. |
| 4,778,004 A | 10/1988 | Paulman et al. |
| 5,042,576 A | 8/1991 | Broadbent |
| 5,501,270 A * | 3/1996 | Young et al. .......... 165/151 |
| 5,732,666 A | 3/1998 | Lee |
| 5,738,168 A | 4/1998 | Patel et al. |
| 5,765,630 A | 6/1998 | Bloomer |
| 6,857,468 B2 | 2/2005 | Emrich |
| 7,031,154 B2 | 4/2006 | Bash et al. |
| 7,246,438 B2 * | 7/2007 | Nozaki et al. ......... 29/890.047 |
| 2002/0066550 A1 | 6/2002 | Tavassoli |
| 2003/0094266 A1 | 5/2003 | Fritsch |
| 2003/0140298 A1 | 7/2003 | Koprivica |
| 2004/0000393 A1 | 1/2004 | Tavassoli |
| 2004/0230662 A1 | 11/2004 | Estrada et al. |
| 2004/0268244 A1 | 12/2004 | Levanoni et al. |
| 2005/0204272 A1 | 9/2005 | Yamagishi |
| 2007/0119569 A1 | 5/2007 | Campbell et al. |
| 2007/0121295 A1 | 5/2007 | Campbell et al. |
| 2007/0272396 A1 | 11/2007 | Campbell et al. |
| 2007/0295492 A1 | 12/2007 | Sharp et al. |
| 2008/0017360 A1 | 1/2008 | Campbell et al. |

OTHER PUBLICATIONS

Office Action for U.S. Appl. No. 11/420,237 (U.S. Patent Publication No. 2007/0272396 A1), dated Feb. 20, 2008.

Office Action for U.S. Appl. No. 11/420,237 (U.S. Patent Publication No. 2007/0272396 A1), dated Aug. 11, 2008.

* cited by examiner

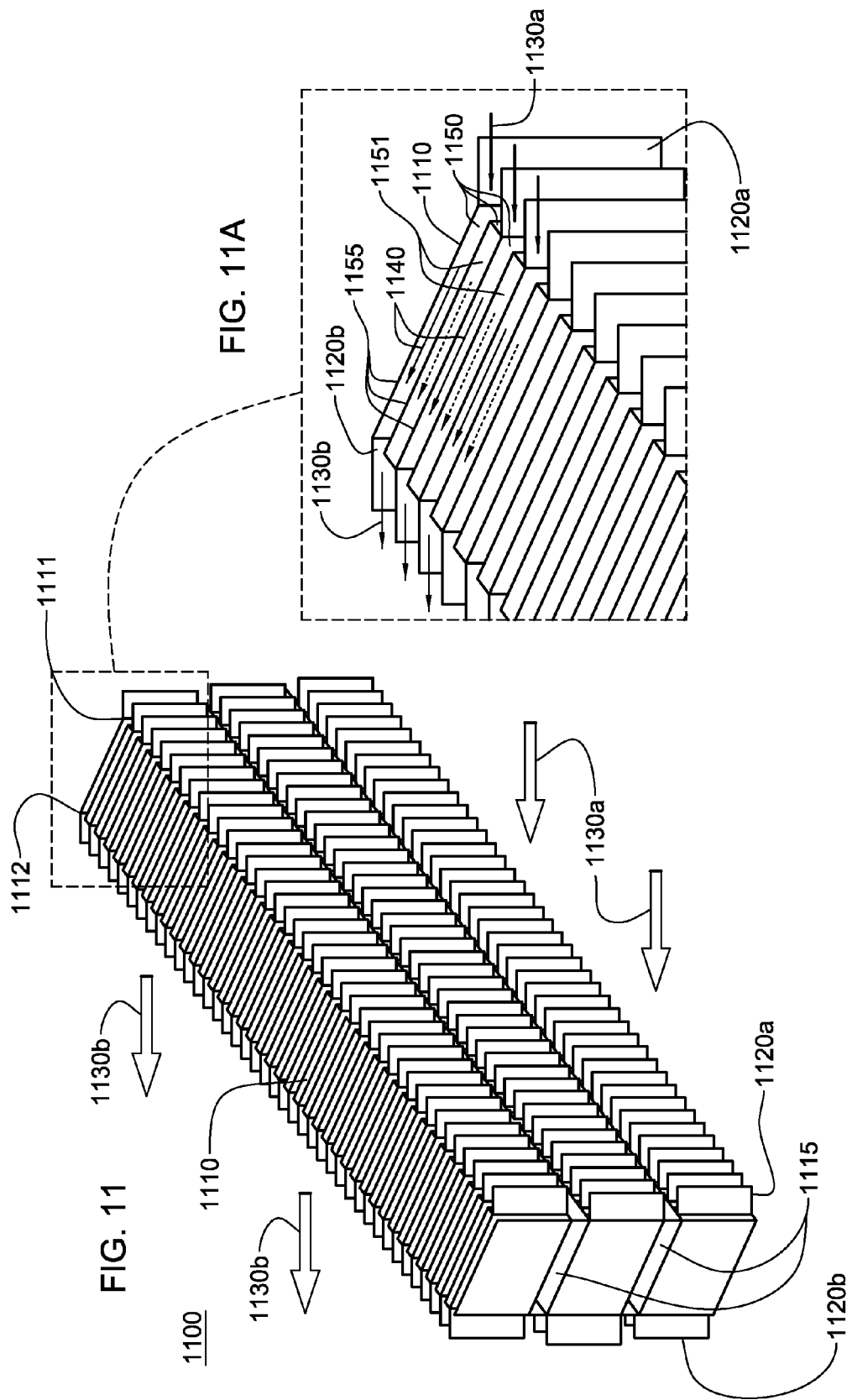

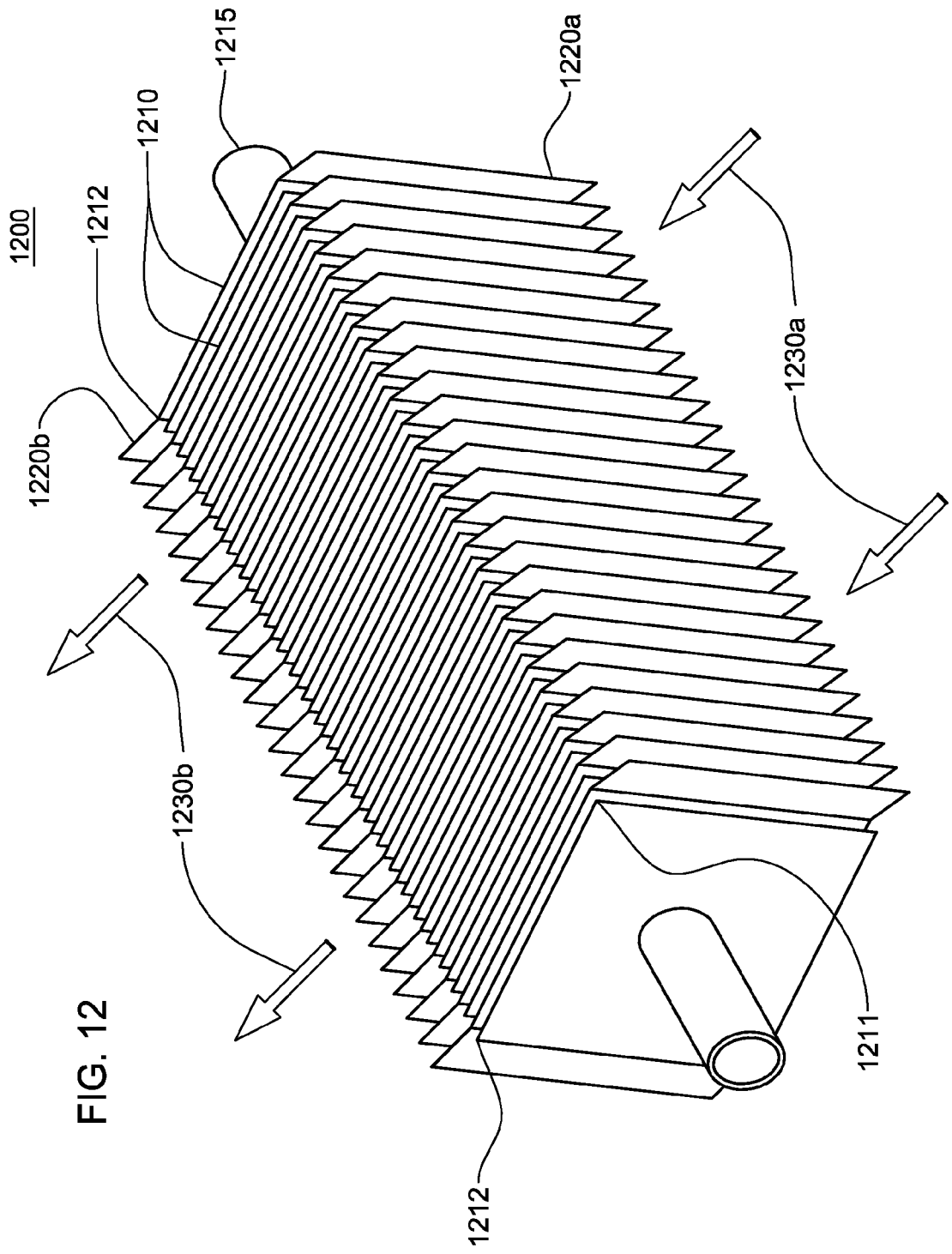

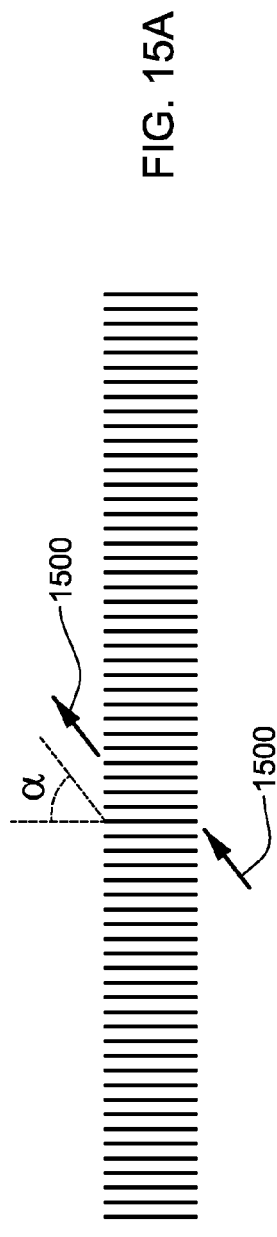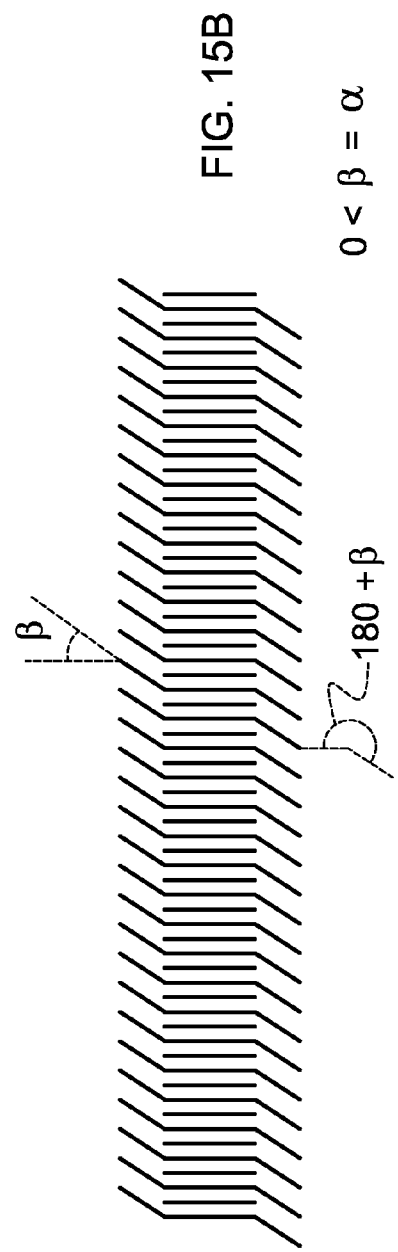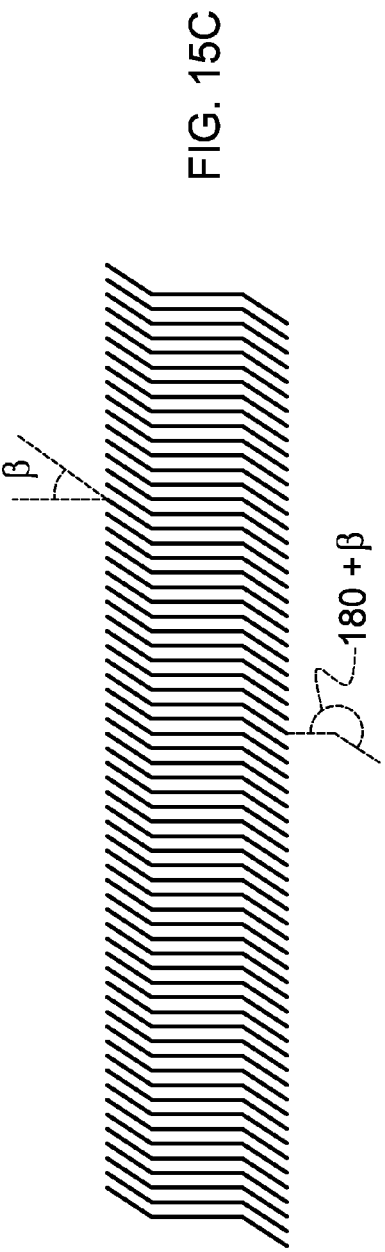

METHOD OF FABRICATING A HEAT EXCHANGER WITH ANGLED SECONDARY FINS EXTENDING FROM PRIMARY FINS

CROSS-REFERENCE TO RELATED APPLICATIONS

This application is a divisional application of U.S. patent application Ser. No. 11/458,696, filed Jul. 20, 2006, and entitled "Heat Exchanger with Angled Secondary Fins Extending from Primary Fins", by Campbell et al., which was published on Jan. 24, 2008, as U.S. Patent Publication No. US 2008/0017360 A1, and which is hereby incorporated herein by reference in its entirety.

This application contains subject matter which is related to the subject matter of the following applications and patents, each of which is assigned to the same assignee as this application, and hereby incorporated herein by reference in its entirety:

"Heat Exchanger with Angled Fin", Campbell et al., Ser. No. 11/420,237, filed May 25, 2006, published Nov. 29, 2007 as U.S. Patent Publication No. US 2007/0272396 A1.

TECHNICAL FIELD

The present invention relates generally to heat transfer mechanisms, and more particularly, to cooling of heat generating components used in computing system environments. Still more particularly, the present invention relates to cooling of heat generating components used in large computing environments, such as rack or blade mounted computer server units.

BACKGROUND OF THE INVENTION

As is well known, as circuit density of electronic devices increases in order to achieve faster and faster processing speeds, there is a corresponding increasing demand for the removal of heat generated by these devices. The increased heat load arises both because the devices are packaged more closely together and because the circuits themselves are operated at increasingly higher clock frequencies. Nonetheless, it is also known that thermal runaway conditions and excessive heat generated by circuits is a leading cause of failure of electronic devices. Furthermore, it is anticipated that the demand for heat removal from these devices will increase indefinitely.

Accordingly, there is a large and significant need to provide useful cooling mechanisms for electronic components, individually and at all levels of packaging, including for example, rack-mounted or blade-mounted electronic components of various large computer systems today.

SUMMARY OF THE INVENTION

Briefly summarized, provided herein in one aspect is a heat exchanger which includes: a plurality of primary fins oriented parallel; and at least one plurality of secondary fins extending from at least one of a leading edge and a trailing edge of the plurality of primary fins. Each secondary fin extends from a respective primary fin at an angle other than 0° to facilitate airflow through the heat exchanger.

In another aspect, a cooled electronics system is provided which includes: at least one heat generating component; a housing containing the at least one heat generating component; an air-moving device for moving air within the housing containing the at least one heat generating component; and an air-to-liquid heat exchanger disposed within the housing. The air-to-liquid heat exchanger includes a plurality of primary fins oriented parallel and at least one plurality of secondary fins extending from at least one of a leading edge and a trailing edge of the plurality of primary fins. Each secondary fin extends from a respective primary fin at an angle other than 0° to facilitate airflow through the air-to-liquid heat exchanger, wherein the airflow through the air-to-liquid heat exchanger is at least partially established by the air-moving device.

In a further aspect, a method of fabricating a heat exchanger is provided. The method includes: forming a plurality of primary fins oriented parallel, the plurality of primary fins having a leading edge and a trailing edge relative to an anticipated direction of airflow through the heat exchanger, wherein the heat exchanger is to be disposed at an angle with respect to the direction of airflow; and wherein the forming includes forming at least one plurality of secondary fins extending from at least one of the leading edge and the trailing edge of the plurality of primary fins, each secondary fin extending from a respective primary fin at an angle other than 0°, wherein the angle that at least some secondary fins extend from the respective primary fins is selected to reduce pressure drop through the heat exchanger based on anticipated orientation of the heat exchanger relative to the direction of airflow on at least one of an air inlet side or an air outlet side of the heat exchanger.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 11 & 11A depict an alternate embodiment of a heat exchanger having angled secondary fins extending from primary fins, in accordance with an aspect of the present invention;

FIG. 12 depicts an alternate embodiment of a heat exchanger with angled secondary extending from primary fins, in accordance with an aspect of the present invention;

FIG. 15A is a conventional heat exchanger schematic showing a direction of airflow on an air inlet and an air outlet side of the heat exchanger assuming, for example, angled disposition of the heat exchanger relative to the direction of airflow;

FIG. 15B is a schematic of one embodiment of a heat exchanger with angled secondary fins extending from primary fins, and assuming the same direction of airflow as shown in FIG. 15A, in accordance with an aspect of the present invention;

FIG. 15C is an alternate embodiment of a heat exchanger with angled secondary fins extending from primary fins, again assuming the same direction of airflow as shown in FIG. 15A, in accordance with an aspect of the present invention.

BEST MODE FOR CARRYING OUT THE INVENTION

Figure 1A:
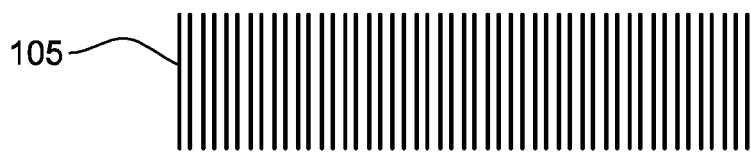
FIGS. 1A-1C depict a conventional flat tube and folded fin heat exchanger.

As used herein, "electronics system" comprises one or more heat generating components of a computer system or other electronics system requiring cooling. By way of example, an electronics system may comprise a mainframe server in one implementation. The term "electronics rack" includes any housing, frame, rack, blade server system, etc., having a heat generating component of a computer system or electronics system, and may be, for example, a stand alone computer processor having high, mid or low end processing capability. In one embodiment, an electronics rack may comprise multiple electronics drawers, each comprising an electronics system with one or more heat generating components requiring cooling. Each heat generating component may comprise an electronics device, such as an electronics component, an integrated circuit chip, a single-chip electronics module, a multi-chip electronics module, etc.

A "heat exchanger" means any heat exchange mechanism through which coolant can circulate; and includes, one or more discrete heat exchange devices coupled either in series or in parallel. A heat exchange device may comprise, for example, one or more coolant flow paths, formed of thermally conductive fluid conduit (such as copper, brass or other tubing) in thermal or mechanical contact with a plurality of air-cooled primary fins (formed of a thermally conductive material, such as copper). Unless otherwise specified, size, configuration and construction of the heat exchangers described herein below can vary without departing from the scope of the present invention.

One example of coolant passing through the thermally conductive fluid conduit of the heat exchanger is water. However, the concepts disclosed herein are readily adapted to use with other types of coolant. For example, the coolant may comprise a brine, a fluorocarbon liquid, a liquid metal, or other similar coolant, or a refrigerant, while still maintaining the advantages and unique features of the present invention.

As explained briefly above, advances in semiconductor technology have led to an exponential increase in microprocessor performance over the past several years. This has led to a steep increase in consumed rack power within the air-cooled data center equipment, representing a significant thermal design and cooling challenge. Increasing heat load and local heat flux in mid-range and high-volume server packages has become a significant factor in the implementation of new CMOS technology. Current air-cooled heat sinks, even those employing vapor-chamber heat spreaders, are reaching the limit of their extendibility to the new hotter microprocessors.

Data center equipment can house several hundred, and sometimes several thousand, microprocessors. Facility level air cooling of these data center systems is typically carried out using large air conditioning units that supply chilled air to the front of the server racks by an under-floor or overhead ducting system. These air cooling options have limitations with respect to the maximum heat flux they can support, which is typically in the 50-200 Watts per square foot range. Data center heat fluxes, especially in localized regions can far exceed these values, and can be as high as 500 Watts per square foot, when current high performance, high power server racks (20-35 kW/rack) are brick-walled to form high density clusters. The efficient cooling of such computer systems is one focus of the present invention. However, the concepts disclosed herein are equally applicable to other computing environments, including personal computers and laptops.

Disclosed herein are various heat exchanger embodiments referred to as "angled fin heat exchangers" and "heat exchangers with angled secondary fins extending from primary fins". Angled fin heat exchangers are described below with reference to FIGS. 4A-10, while heat exchangers with angled secondary fins extending from primary fins are described below with reference to FIGS. 11-16. Before discussing these novel heat exchanger embodiments, however, various drawbacks to traditional heat exchangers placed at oblique angles are described with reference to FIGS. 1A-3.

Figure 1B:
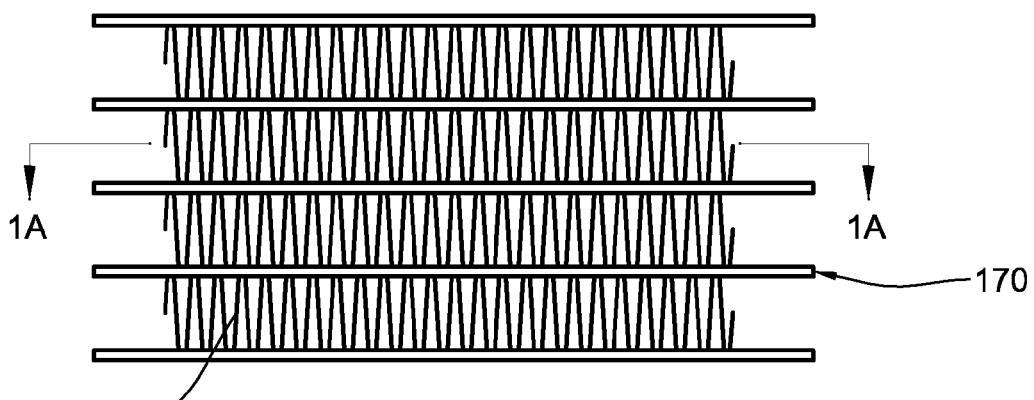
Figure 1C:
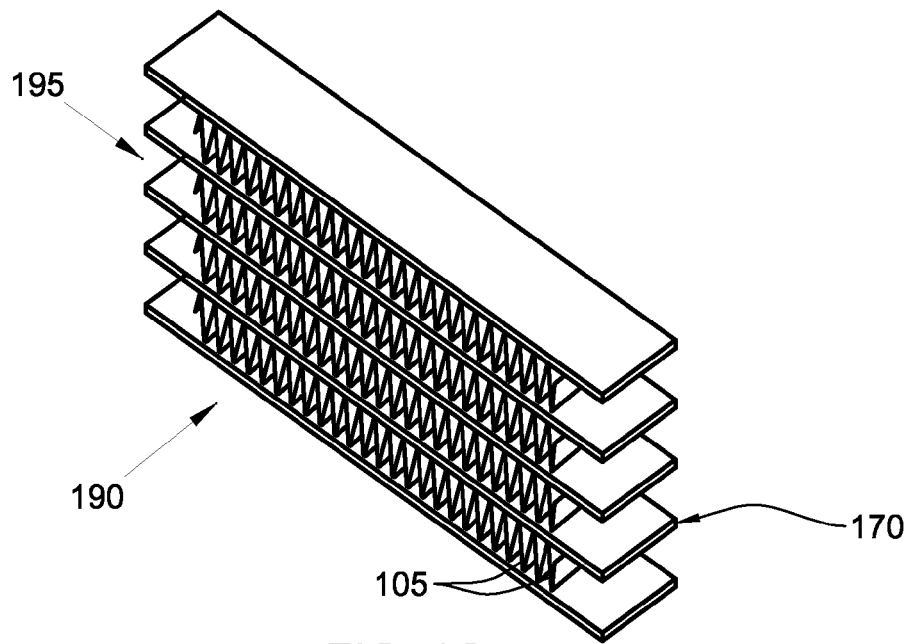

FIGS. 1A-1C illustrate a core heat exchange mechanism of a heat exchanger such as the widely known compact copper/brass heat exchanger currently used in the computer industry. It should be noted that in the figures, the manifolds at the ends of the brass tubes are not shown.

FIG. 1B is a cross-sectional front view illustration of a folded copper fin 105. Flat brass tubes 170 are also illustrated.

FIG. 1A is a cross-sectional illustration of the heat exchanger of FIG. 1B, cut across lines 1A-1A. The basic air side flow structure of FIG. 1A is significant for understanding aspects of the present invention. For ease of understanding, a perspective view of the heat exchanger is also provided at FIG. 1C, wherein liquid flows through coolant conduits or tubes 170 and air flows through the fins 105 as illustrated and referenced respectively by arrows 195 and 190. As understood from these figures, air is essentially channeled orthogonal to the frontal area or leading edge of the heat exchanger. Consequently, for a heat exchanger disposed at an angle relative to airflow direction, the air must turn going into and out of the fin structure, potentially resulting in a significant increase in pressure drop. In fact, pressure drop can be as much as ten times higher at the same volume of airflow through a heat exchanger in an airflow orientation normal to the front face of the heat exchanger.

Figure 2:
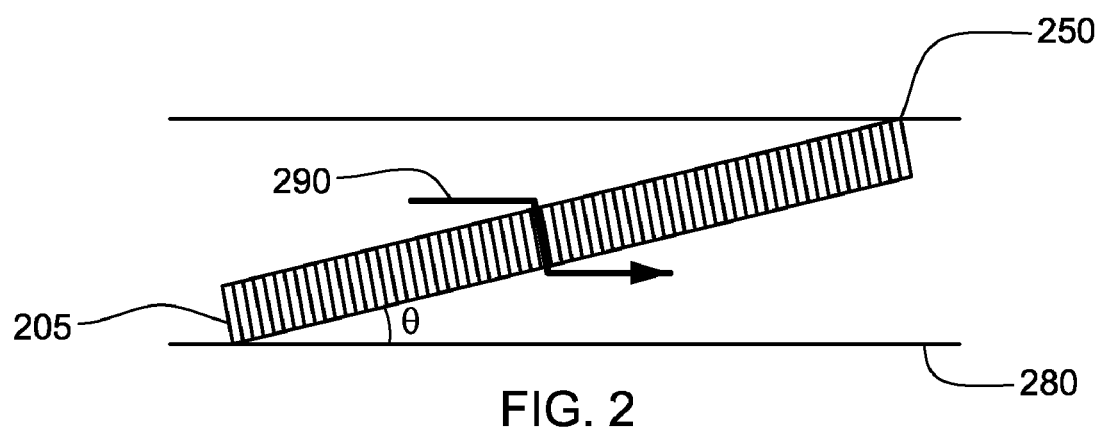
FIG. 2 is a partial cross-sectional representation of a heat exchanger disposed at an angle relative to a direction of airflow, for example, in the electronics frame sidecar application of FIG. 3.

FIG. 2 illustrates disposition of a heat exchanger 250 at an oblique angle θ with respect to a horizontal axis 280 of an airway conduit. Air flows through fins 205 of heat exchanger 250 as depicted by arrow 290. Forcing air to enter through the heat exchanger at an oblique angle to the upstream airflow results in substantial loss in air pressure. This pressure loss adversely affects the system airflow rate, thereby impairing dissipation of heat from the system.

Figure 3:
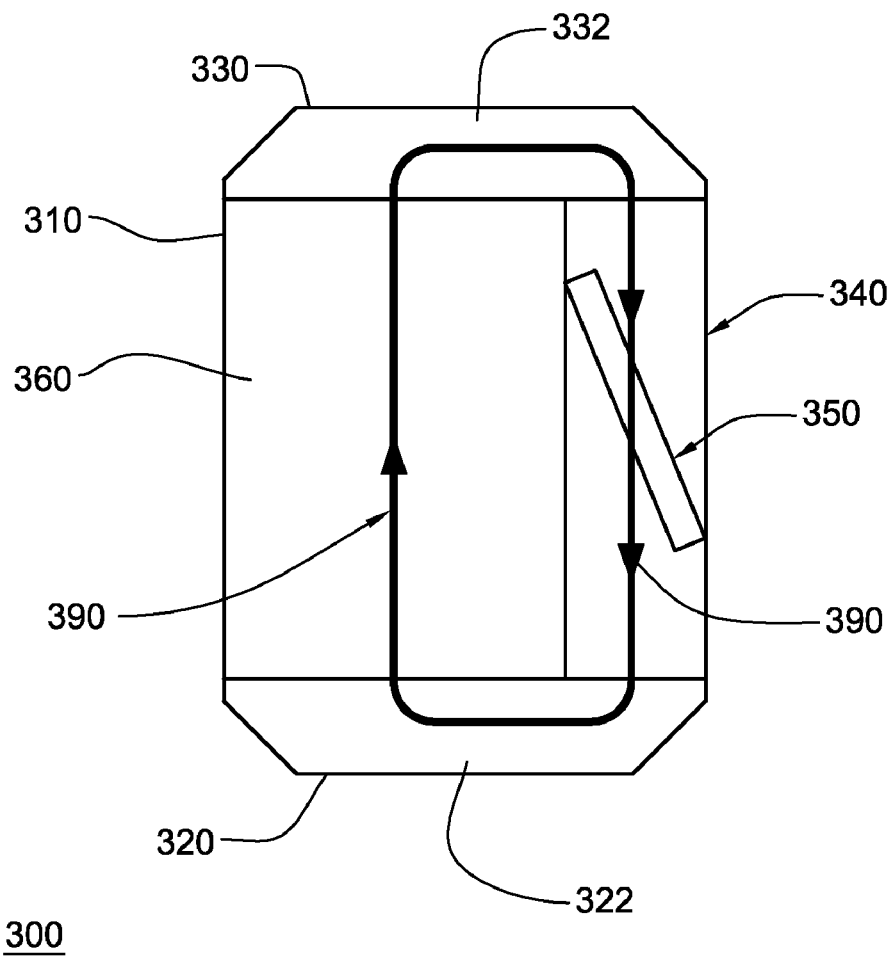
FIG. 3 is a partial cross-sectional plan view of a horizontal closed-loop airflow heat removal system for an electronics frame with a side-mounted cooling system (cooling connections to the heat exchanger not shown), to be implemented in conjunction with one of the various heat exchanger embodiments disclosed herein, in accordance with an aspect of the present invention.

FIG. 3 is a plan view illustration of a closed, horizontal airflow rack level heat removal system 300, used to house one or more computers or computing environments (such as servers). It should be noted again that while the workings of heat exchangers in accordance with aspects of the present invention are described below in conjunction with a computing environment such as the one illustrated in FIG. 3, this is only done for ease of understanding. The workings of the present invention can be equally applicable to any heat exchanger used in any other computing environment or electrical device, or in other similar environments and its use is not particularly limited to computers and computing environments per se.

As shown in FIG. 3, a frame assembly 310 includes a front 320, housing a front cover 322; and a back 330, housing a back cover 332. In the embodiment illustrated, a side mounted cooling sub-frame 340, interchangeably referenced hereinafter as side car 340, is also provided. The side mounted sub-frame 340 houses a heat exchanger 350 that is disposed, as illustrated in the figure, at an oblique angle. As noted above, while FIG. 3 illustrates a side mounted sub-frame arrangement, the heat exchanger in question could reside in any other angled arrangement as discussed herein and still benefit from the workings of the present invention.

In FIG. 3, the heat generating electronics and other such related components (not individually shown), are disposed in the electronics frame 360. In the embodiment illustrated, the electronics and the associated frame 360 are disposed adjacent to the side mounted sub-frame 340 housing the heat exchanger 350 so as to directly and immediately benefit from the ensuing cooling effects. This is because the placement of the heat exchanger 350 and the other components allows for a closed loop airflow with the direction of the generalized airflow path being illustrated in FIG. 3, as referenced by use of arrows and reference numeral 390. More particularly, heat exchanger 350 enables heat to be transferred from the hot exhaust air exiting the servers within electronics frame 360 to chilled water passing through the heat exchanger from a chilled liquid source (not shown) disposed, for example, outside system 300. By angling the heat exchanger as shown in FIG. 3, airflow through the heat exchanger necessarily makes two turns when passing through the fin core; that is, a first turn as the airflow enters the fin core, and a second turn as the airflow exits the fin core.

The angled heat exchanger design provides for cooling rack-mounted modular electronic units, and addresses some of the defects existing in the prior art by combining an air cooling approach with an air-to-water heat exchanger fixed within the server cabinet. In this regard, the oblique heat exchanger 350 design of FIG. 3 is designed to minimize overall system floor space while maintaining a given thermal performance. This is because of the change in design of many such servers. Traditionally, in many large server applications, processors along with their associated electronics are packaged in removable drawer configurations stacked within a rack or frame or in fixed locations within the rack or frame. The desire to increase the number of components while maintaining the same or slightly larger footprints has lead to a scenario where the heat exchanger is housed in very narrow areas, sometimes necessitating that the heat exchanger 350 be angled as shown in FIG. 3.

As an alternate electronics system implementation to that illustrated in FIG. 3, a closed loop liquid system (not shown) including cold plates, direct liquid impingement modules, or other high performance liquid cooling structures on the microprocessors can be employed, along with an approximately five (5) inch side-attached drawer containing an air-moving device, liquid pump, and heat exchanger. The heat exchanger in this configuration is also typically angled relative to the airflow pathway through the side-attached drawer in a manner analogous to that depicted in FIG. 3, and the same high-flow resistance occurs in this geometry as well. Thus, disclosed herein are various heat exchanger designs which alleviate the high pressure drop associated with these angled flow configurations.

Figure 4A:
FIG. 4A is a cross-sectional plan view representation of one embodiment of an angled fin heat exchanger, in accordance with an aspect of the present invention.
Figure 4B:
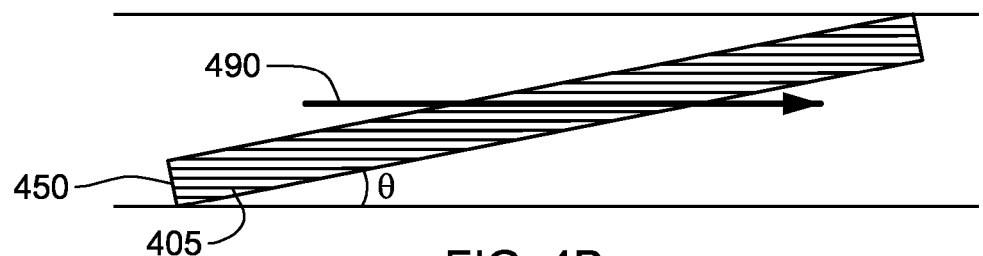
FIG. 4B is a cross-sectional plan view representation of the heat exchanger of FIG. 4A shown disposed within an airflow conduit, in accordance with an aspect of the present invention.

FIGS. 4A & 4B are a sectional cut schematic representation of a heat exchanger, such as a copper/brass heat exchanger currently being used by the industry. As can be seen, FIG. 4B illustrates a similar sectional view as provided by prior art FIG. 2 previously discussed. Direction of airflow is shown by arrow 490. The heat exchanger, referenced here as 450, is tilted at an angle θ with respect to the horizontal axis and the direction of airflow. In the embodiment shown specifically in FIG. 4A, however, the fins 405 (e.g., folded fins) form an oblique angle φ, with respect to the normal of the frontal area of the heat exchanger.

As illustrated in FIG. 4B, by making the value of angle φ equal to 90−θ, the airflow channels formed by the angled folded fins 405 become parallel to the direction of airflow when the heat exchanger is angled by θ. It is noted that air no longer turns as was the case in FIGS. 1 & 2, but the channel flow length is significantly longer than that of the normal channel configuration. Since the pressure drop within the channel itself is proportional to the channel flow length, the pressure is also significantly higher. For example, for a heat exchanger angle θ of 15 degrees which is representative for the side car application with this type of heat exchanger, the angled channel flow length is almost four times that of the normal channel flow length.

Figure 5A:
FIG. 5A is a cross-sectional plan view representation of an alternate embodiment of an angled fin heat exchanger, which demonstrates an angle of attack, in accordance with an aspect of the present invention.
Figure 5B:
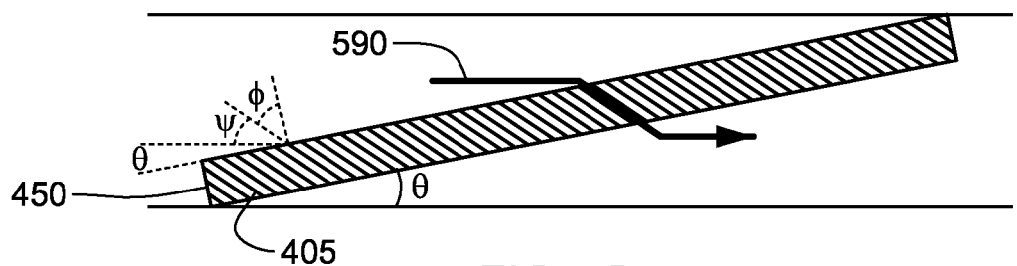
FIG. 5B is a cross-sectional plan view representation of the angled fin heat exchanger of FIG. 5A, shown disposed at an angle within an airflow conduit, in accordance with an aspect of the present invention.

The pressure drop through the heat exchanger in an oblique orientation is primarily a function of the degree of air turning and the channel flow length. The degree of air turning is represented by an angle of attack ψ. Angle ψ is defined as the angle between the upstream airflow direction and the folded fins/channels and is related to the heat exchanger angle θ and fin angle φ as shown in FIGS. 5A & 5B. (Direction of airflow provided by arrows and associated reference numerals 590).

As illustrated, FIG. 5A is a depiction of the orientation of angle φ, while FIG. 5B illustrates the relationship between angle ψ with respect to angle θ, angle φ and the horizontal axis. FIG. 5B, especially, illustrates a sectional cut schematic representation of the heat exchanger 405 with angled folded fins 405 having an optimum fin angle of attack ψ which is defined as 90−(θ+φ).

For example, an attack angle of zero degrees represents the "no air turning" configuration shown and discussed above in conjunction with the embodiment of FIGS. 4A & 4B. On the other hand, an attack angle of (90−θ) represents the conventional heat exchanger configuration of φ being equal to zero as was discussed in conjunction with embodiments of FIGS. 1 & 2.

As the angle of attack increases from a value of zero, the air turning contribution to pressure drop increases, but the channel pressure drop decreases because of the decreasing channel flow length. A computational fluid dynamics analysis was undertaken to demonstrate that there is an optimum attack angle, and thus an optimum fin angle, for which pressure drop is a minimum. The results of the analysis are provided in FIG. 6.

Figure 6:
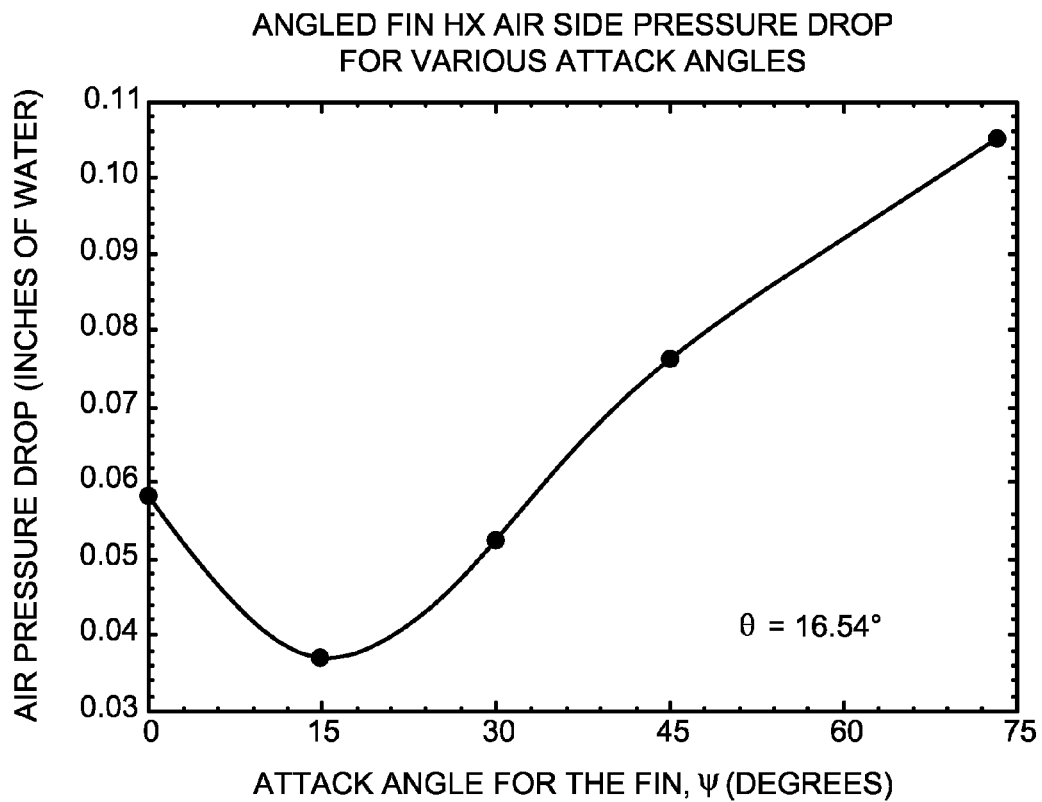
FIG. 6 is a graphical depiction of the relationship between angle of attack and air pressure drop through an angled fin heat exchanger such as depicted in FIGS. 4A-5B, in accordance with an aspect of the present invention.

FIG. 6 is a graphical depiction of the computational fluid dynamics (CFD) calculations performed to establish the relationship between angled fin air side pressure drop and various attack angles. As illustrated, the air pressure drop that was calculated in inches of water is represented by the vertical axis, while the value of the attack angle is plotted on the horizontal axis.

Note that angle θ, for this graph has been consistently kept at a value of 16.54 degrees as illustrated. At a zero attack angle, as shown, the air pressure drop value is 0.058 inches of water and this value actually decreases to less than 0.04 inches of water at around a 15 degree angle of attack and then from that point on the air pressure drop value increases. It should be noted that the example provided in the graph depicted in FIG. 6 is only to aid understanding and the results can vary depending on the variables used. In other words, there is no single unique fin angle since the pressure drop is also a function of the heat exchanger depth and the fin spacing. The optimal angle of attack is dependent on heat exchanger depth, fin spacing and orientation of the heat exchanger and its location in the frame (i.e., side car, or more generally, airflow conduit).

Figure 7A:
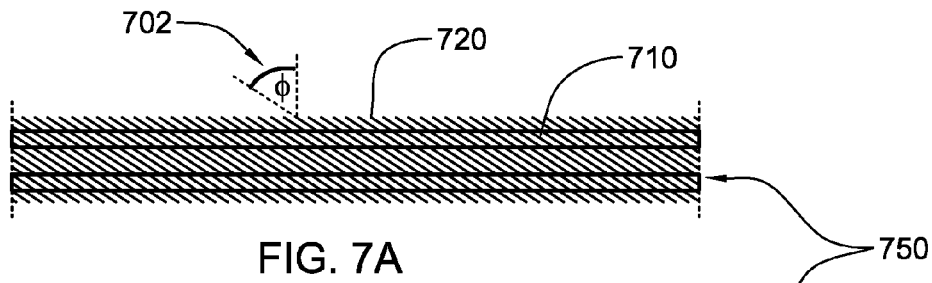
FIGS. 7A & 7B depict an alternate embodiment of an angled fin heat exchanger, in accordance with an aspect of the present invention.

FIGS. 7A-8B depict an alternate embodiment of an angled fin heat exchanger, in accordance with aspects of the present invention, having a tubular structure and fins provided at an oblique angle with respect to its frontal area. FIGS. 7A & 7B depict cross sectional views of the structure, which are disposed in different orientations.

Figure 7B:
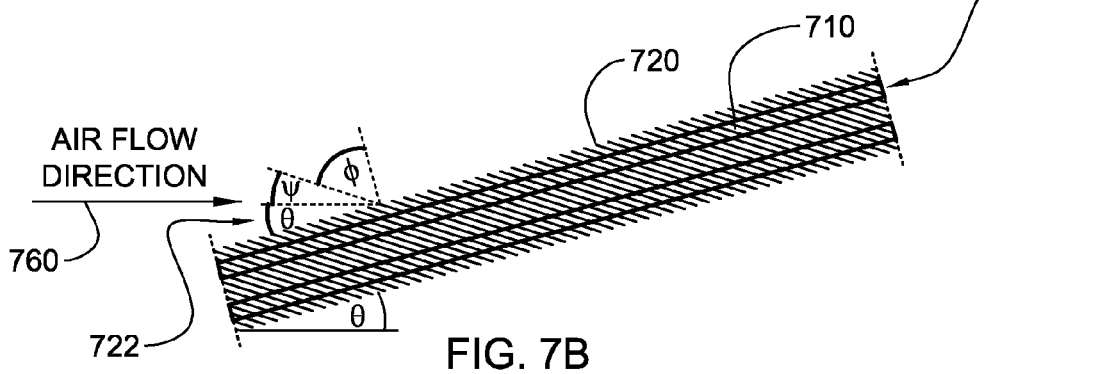

FIG. 7A is a cross-sectional illustration wherein a section of the active core region with the fins at an angle φ (702), is provided with respect to the heat exchanger frontal area. In a preferred embodiment, the tubular structure is a round tube 710 as referenced in the figures. In one implementation, the tube 710 is disposed to run horizontally with respect to gravity. FIG. 7B shows the same heat exchanger section positioned at an angle θ (722) with respect to the direction of airflow 760.

Figure 8A:
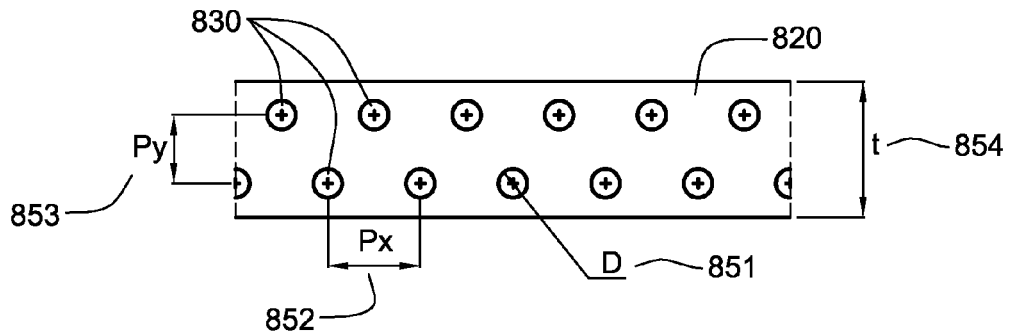
FIGS. 8A & 8B depict a further alternate embodiment of an angled fin heat exchanger, in accordance with an aspect of the present invention.
Figure 8B:
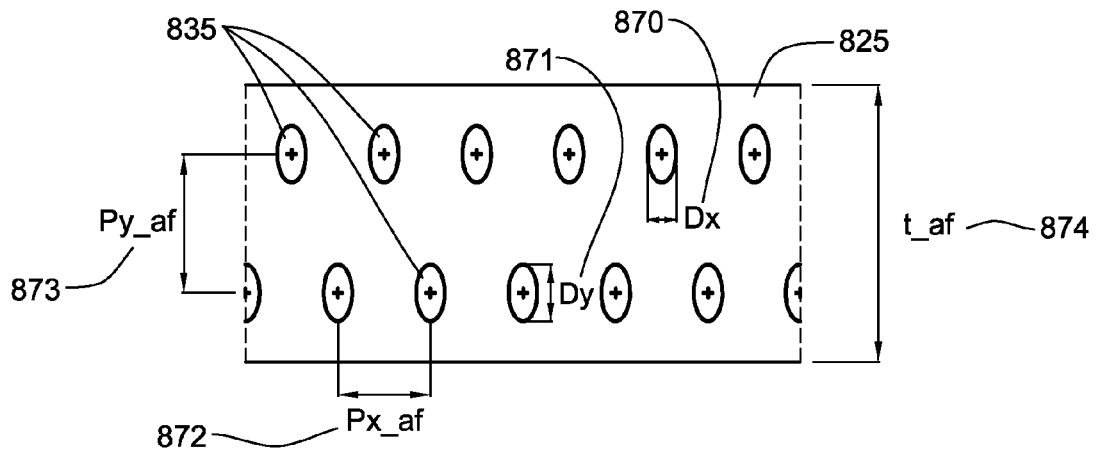

FIGS. 8A & 8B illustrate other details about the fins, particularly as discussed with reference to the embodiment of FIGS. 7A & 7B. FIG. 8A provides a top down illustrations of unmodified fins 820, while FIG. 8B provides a similar illustration with respect to modified fins 825, as will be discussed in more detail below. Both the modified and unmodified fins 825 and 820 can be disposed on a structure, similar to the tubular structure 710 of FIGS. 7A & 7B.

FIG. 8A illustrates an unmodified fin(s) 820 with a staggered array of holes 830 punched out to fit over the associated structure (which in this embodiment can be a tube bank) according to the embodiment illustrated in FIGS. 7A & 7B. As illustrated in the figure, "D" (referenced as 851) is a tube hole diameter. Px (referenced as 852) is the tube hole pitch in the x-direction, which in this case is further defined by the direction of the heat exchanger. Similarly, Py (853) is the tube hole pitch in the y-direction (i.e., in the direction of heat exchanger depth or thickness). Finally "t" is the fin depth 854, which can be equal to the heat exchanger depth or thickness in the illustrated embodiment of FIG. 8A.

FIG. 8B is a top down illustration of one embodiment of the present invention showing fin modifications. The fin modification, as illustrated in FIG. 8B, is designed to ensure that the fins remain in complete circumferential contact with the tubes for the best heat transfer effectiveness. In this embodiment, the fins are referenced as 825 and holes as 835. Dx (referenced by numerals 870) is the minor diameter of the tube hole in an angled fin. Dy (referenced as 871) is a major diameter of the tube hole in an angled fin. Px_af 872 and Py_af 873 are respectively the tube hole pitch in x- and y-directions for the angled fin. Finally t_af 874 is the angled fin depth. If "s" is thought of as the spacing between fins along tube axis in an unmodified fin configuration (FIG. 8A), then the following set of equations relate the modified fin version to the unmodified version.

$$Dx = D$$

$$Dy = \frac{D}{\sin(\theta + \psi)}$$

$$Px\_af = Px$$

$$Py\_af = \frac{Py}{\sin(\theta + \psi)}$$

$$t\_af = \frac{t}{\sin(\theta + \psi)}$$

$$s\_af = \frac{s}{\sin(\theta + \psi)}$$

The problem of optimizing the value of different angles including the angle of attack has now been explored, and attention is turned to methods of manufacturing such an optimal folded fins with optimal angles. As will be appreciated by those skilled in the art, a variety of different embodiments can be used to achieve such fabrication goals. For ease of understanding, however, a couple of such methodologies will be explored below. As suggested, however, such methods are only provided as examples and should not be restrictive and limiting as with regards to the teaching of the present invention. A first and second method of fabricating a folded finned heat exchanger with an optimal angle is illustrated in FIGS. 9 & 10.

Figure 9:
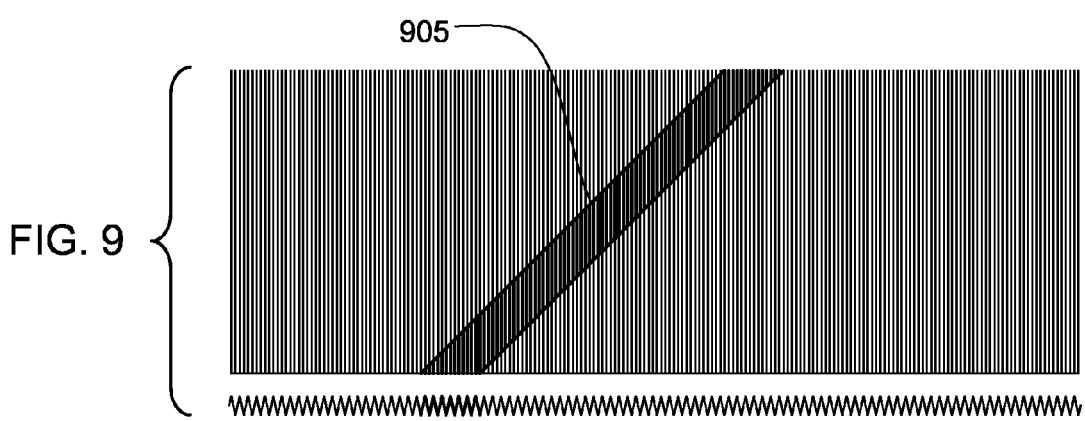
FIG. 9 depicts a first fabrication embodiment for forming folded primary fins for an angled fin heat exchanger, in accordance with an aspect of the present invention.

FIG. 9 is a schematic illustration of a first method of manufacturing folded fins with oblique angle channels by slicing wide fin stock at a desired angle, as shown and achieving angled fins 905. In other words, manufacturing starts with a very wide (deep) folded fin. The wide folded fins are then subsequently cut to a useable width but at a desired (and previously selected) angle with respect to the fins.

Figure 10A:
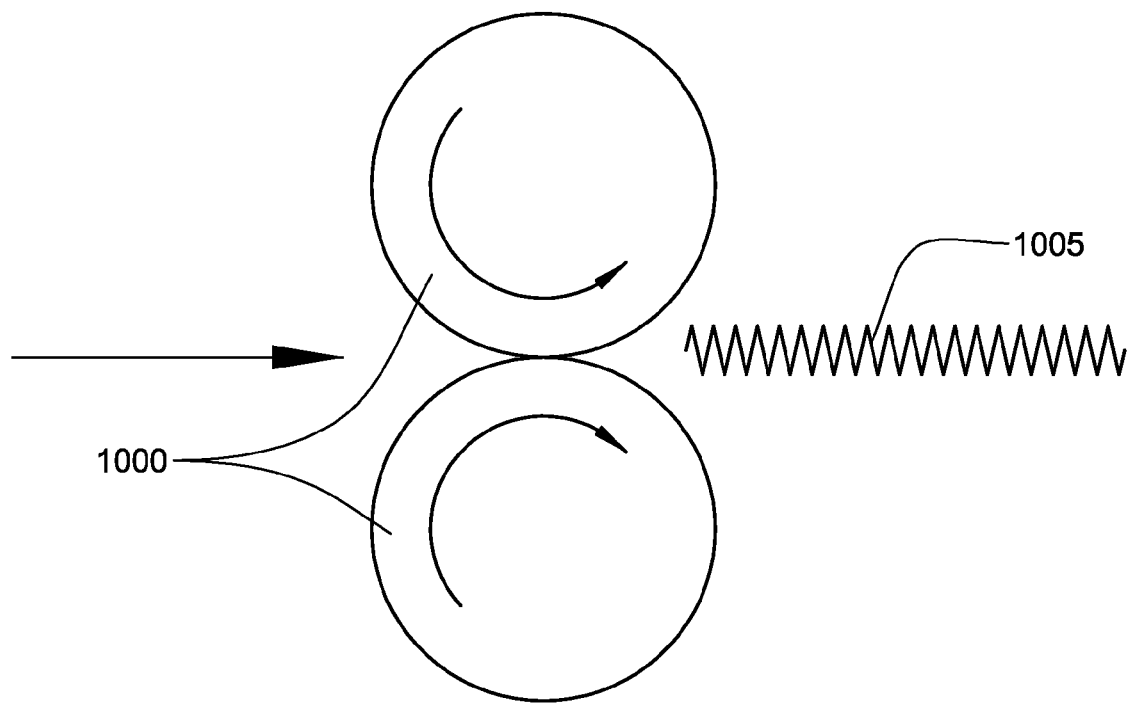
FIGS. 10A & 10B depict an alternate embodiment for forming primary fins for an angled fin heat exchanger, in accordance with an aspect of the present invention.
Figure 10B:
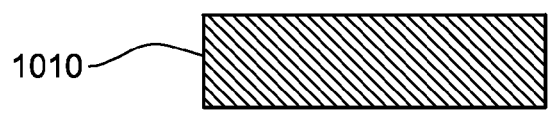

FIGS. 10A & 10B, by contrast, depict a second embodiment for manufacturing of the angled fins. FIG. 10A provides for a schematic illustration of a manufacturing fold fin with oblique angled channels by stamping with oblique angled gear tooth gears 1000. In other words, the folded fins 1005 are stamped using gears 1000 with teeth, shown at 1010 in FIG. 10B, at an oblique angle to the gear axis.

FIGS. 10A & 10B are particularly provided in regard to existing manufacturing techniques so that each method can be easily adopted without much necessity to change the fabrication process steps. This allows for fabrication flexibility and cost effectiveness in manufacturing of the fins.

FIGS. 11 & 11A depict one embodiment of a heat exchanger with angled secondary fins extending from primary fins, in accordance with an aspect of the present invention. This heat exchanger, generally denoted 1100, includes a plurality of primary folded fins 1110 oriented parallel to each other and separated by coolant-carrying conduits 1115 as shown in FIG. 11. A first plurality of secondary fins 1120a extend from a leading edge 1111 of the plurality of primary folded fins 1110 and a second plurality of secondary fins 1120b extend from a trailing edge 1112 of the plurality of primary folded fins 1110. These pluralities of secondary fins, 1120a, 1120b, each extend from the plurality of primary folded tins at an angle other than 0° to facilitate airflow through the heat exchanger.

In the embodiment illustrated, air flows in a direction 1130a at an air inlet side of the heat exchanger and in a direction 1130b at an air outlet side of the heat exchanger, which in this example is the same direction as the direction of airflow on the air inlet side. Thus, the secondary fins on the leading edge of the primary folded fins are angled to extend in the direction of airflow, and the secondary fins at the trailing edge of the primary fins are also angled to extend in the direction of airflow. The secondary fins 1120a at the leading edge of the primary folded fins receive and direct the airflow 1130a into the air passageways or channels 1140 defined by the primary folded fins 1110, which in the embodiment illustrated are defined by a folded fin construction. As illustrated, each primary folded fin comprises a solid plate fin surface with a plurality of bends defining alternating, substantially U-shaped air-passage channels 1150, and a base surface and a top surface 1151. After flowing across the primary folded fins, i.e., through the alternating, substantially U-shaped fins thereof, the airflow is then redirected by the secondary fins 1120b at the trailing edge of the primary fins to align to the direction of airflow 1130b on the outlet side of the heat exchanger.

As shown in the figures, secondary fins 1120a, 1120b function as airflow direction fins or vanes which are integrally formed with the plurality of primary folded fins 1110. Thus, in addition to guiding the airflow into and out of the fin core, the secondary fins also provide greater heat transfer surface area compared with the primary folded fins alone, in the exemplary embodiment, a primary folded fin of the plurality of primary folded fins has (in one example) a plurality of fin sections 1155 extending between a first coolant-carrying conduit section and a second coolant-carrying conduit section with each fin section having a first, similar heat transfer surface area, and each secondary fin of the plurality of secondary fins has a second, similar heat transfer surface area, wherein the first surface area is greater than the second surface area. Although the height of each secondary fin is (in one example) the same or similar to the height of each primary folded fin, the distance that each secondary fin extends from the primary folded fin can vary between implementations, for example, dependent upon size restrictions imposed by the airway conduit within which the heat exchanger is to be placed. As best shown in FIG. 11A, in one embodiment, secondary fins 1120a extend at the leading edge of every other fin section 1155, and secondary fins 1120b extend at the trailing edge of every other fin section 1155. In alternate implementations, the secondary fins could extend, for example, from every third, fourth, fifth, etc., fin section of a particular primary folded fin, provided that a sufficient number of secondary fins extend from the primary folded fins to facilitate redirection of the airflow through the heat exchanger, and thereby reduce the pressure drop across the heat exchanger for a given implementation.

Further, although shown with a first plurality of secondary fins 1120a and a second plurality of secondary fins 1120b, dependent on the implementation, secondary fins may be employed only on the leading edge 1111 or the trailing edge 1112 of the plurality of primary folded fins 1110. Further, the angle that the secondary fins form on the leading edge and the angle that the secondary fins form on the trailing edge may be different and unrelated depending, for example, on the configuration of the airway passage within which the heat exchanger is to be placed.

FIG. 12 depicts an alternate embodiment of a heat exchanger with angled secondary fins extending from primary fins, in accordance with an aspect of the present invention. This heat exchanger, generally denoted 1200, again includes a plurality of primary fins 1210 oriented parallel, and a first plurality of secondary fins 1220a extending from a leading edge 1211 thereof and a second plurality of secondary fins 1220b extending from a trailing edge 1212 thereof. A coolant conduit or tube 1215 extends through the plurality of primary fins 1210 and is in physical contact therewith as shown for the transfer of heat between air passing through the heat exchanger and water flowing through the conduit. In the example illustrated, the first plurality and second plurality of secondary fins are each shown extending from every other primary fin on the leading and trailing edges, respectively, of the primary fins. The angle at which the first plurality of secondary fins 1220a extend is aligned to a direction of airflow 1230a on an air inlet side of the heat exchanger, while the angle at which the second plurality of secondary fins 1220b on the trailing edge 1212 extend aligned to a direction of airflow on an air outlet side of the heat exchanger 1230b.

Figure 13A:
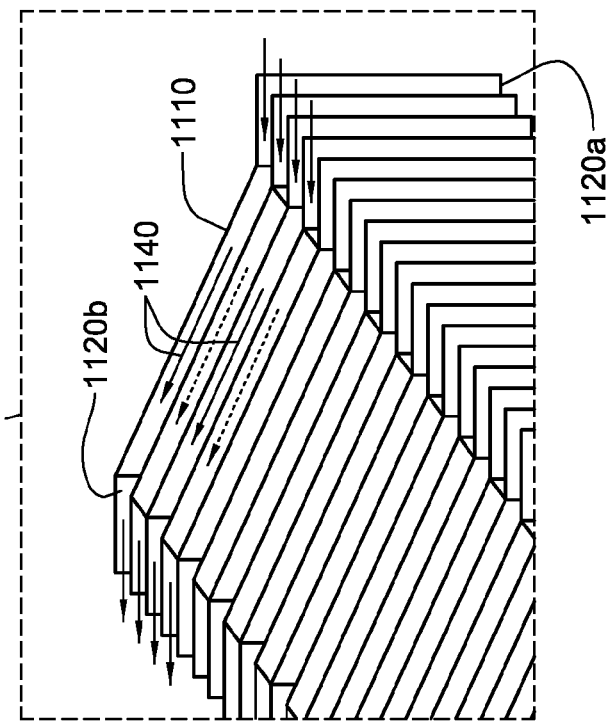
FIGS. 13 & 13A depict a further embodiment of a heat exchanger with angled secondary fins extending from primary fins, in accordance with an aspect of the present invention.
Figure 13:
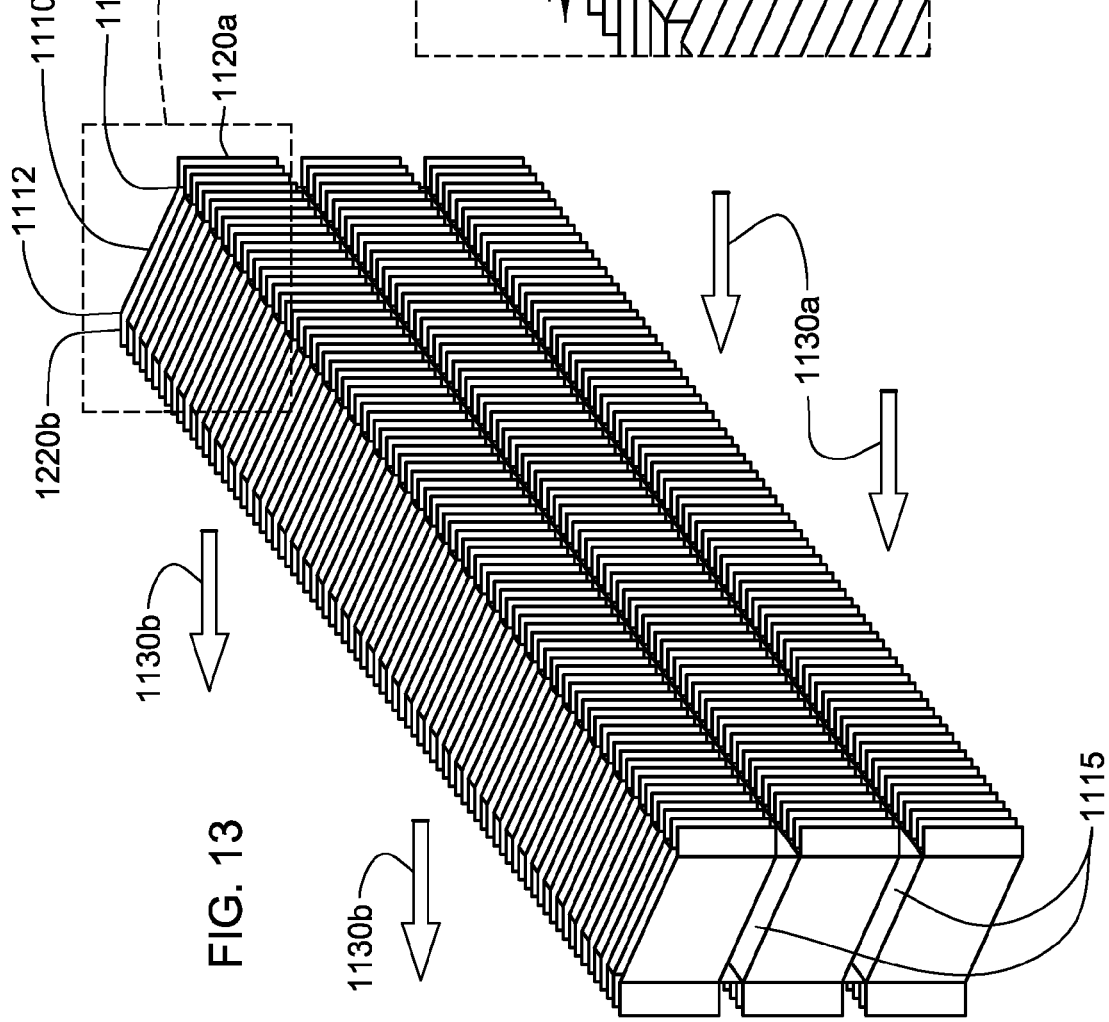
Figure 14:
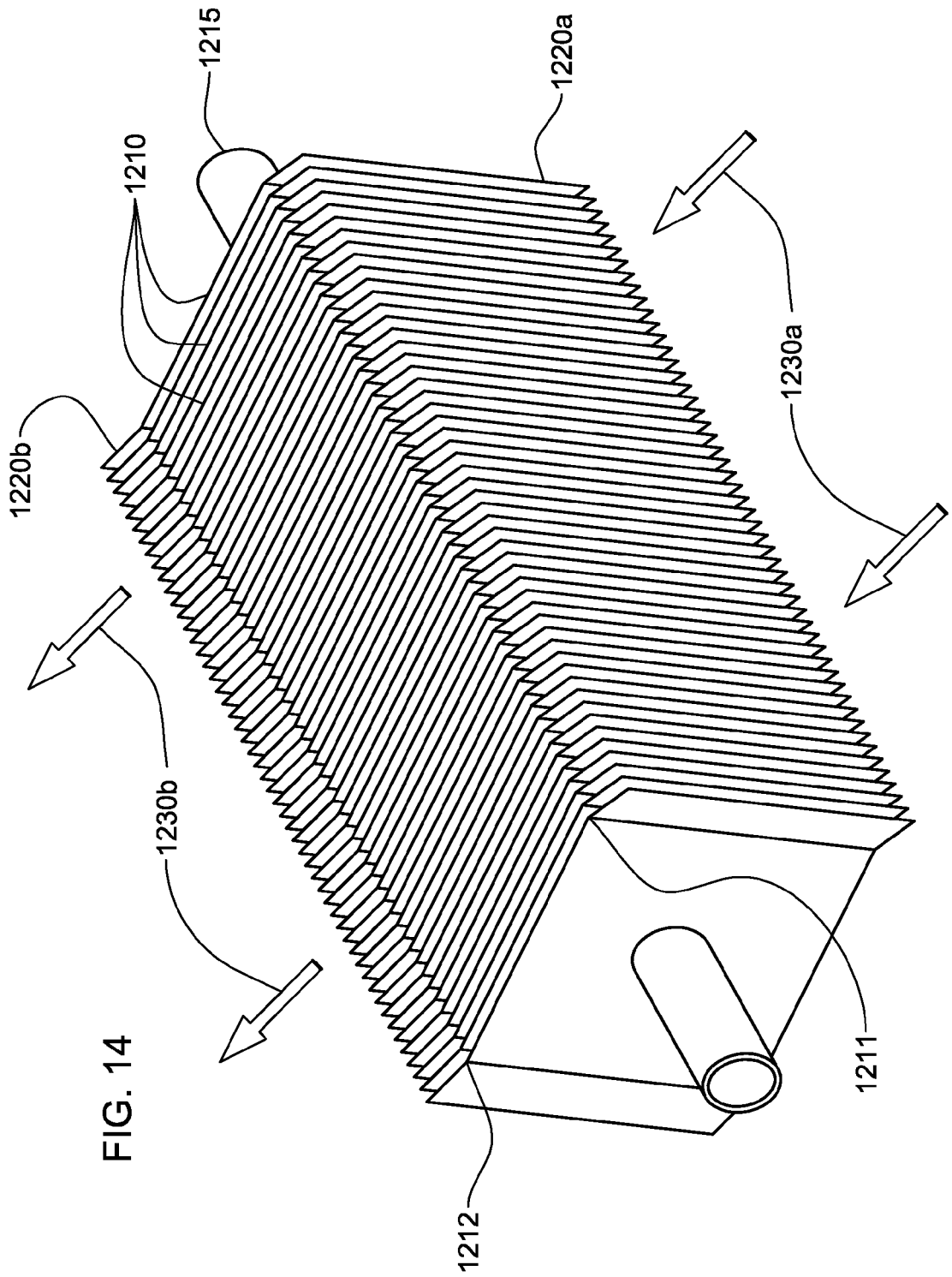
FIG. 14 depicts still another embodiment of a heat exchanger with angled secondary fins extending from primary fins, in accordance with an aspect of the present invention.

FIGS. 13 & 13A depict a heat exchanger with angled secondary fins extending from primary folded fins analogous to that depicted in FIGS. 11 & 11A, only with the secondary fins (1120a or 1120b) extending at the leading edge 1111 and at the trailing edge 1112 from each primary folded fin 1110. Similarly, FIG. 14 is analogous to the heat exchanger with angled secondary fins extending from primary fins of FIG. 12, only with the secondary fins 1220a, 1220b extending from each primary fin 1210 at the leading edge 1211 and the trailing edge 1212, respectively.

FIG. 15A is a cross-sectional plan view representation of a heat exchanger having only primary fins and illustrating a direction of airflow into and from the heat exchanger at an angle to the primary fins. Thus, in FIG. 15A, the air undergoes a turn through angle α as it enters the heat exchanger fins, and then turns again at angle α as the air leaves the primary fins. Thus, the total turning angle of the air is 2α.

FIGS. 15B & 15C illustrate heat exchangers with angled secondary fins extending from primary fins, in accordance with aspects of the present invention. In FIG. 15B, the secondary fins extend from every other primary fin, while in FIG. 15C, the secondary fins extend from every primary fin. The integral secondary fins (and primary fins) are formed at an angle β to the primary fin at the trailing edge of the primary fins, and at an angle 180°+β to the primary fins at the leading edge of the primary fins. Thus, in this case, the airflow turns by a total of 2(α−β) as it enters and exits the heat exchanger. The value of β is greater than zero, and can be as high as α, thus allowing 2(α−β): to be in the range of less than 2α to zero. Therefore, employing a heat exchanger such as illustrated in FIGS. 15B & 15C reduces the turning angle for the airflow in configurations where the heat exchanger is placed at an angle to the airflow, thus reducing the pressure drop associated with turning at the inlet and outlet of the heat exchanger, while also providing additional fin surface area for heat transfer. As noted above, angle β can be the same or different at the leading and trailing edges of the primary fins.

Figure 16:
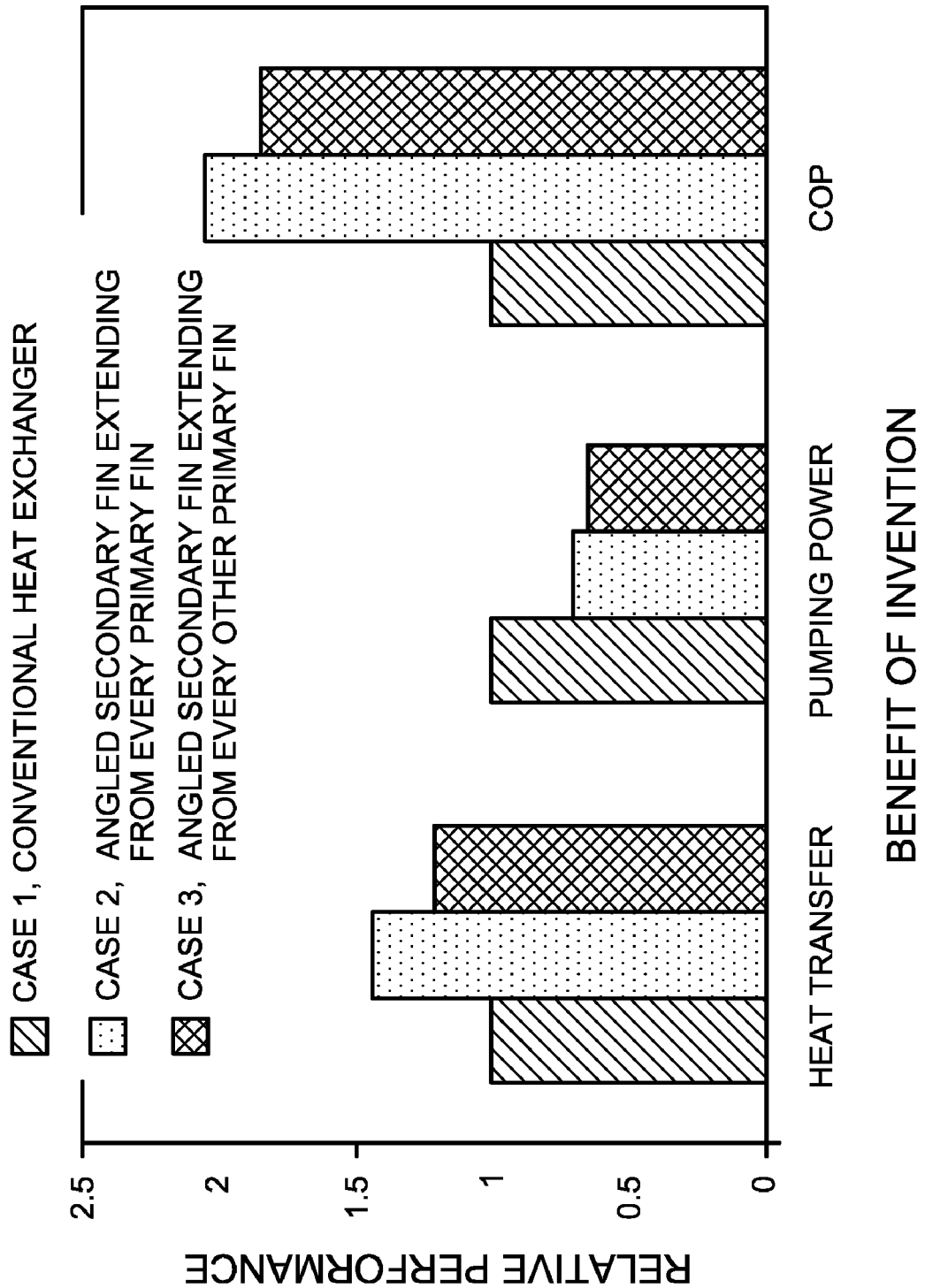
FIG. 16 is a graph of relative performance of the three heat exchangers of FIGS. 15A-15C, showing relative heat transfer, pumping power and coefficient of performance of the heat exchangers, and illustrating the benefits of the heat exchanger embodiments of FIGS. 15B & 15C, in accordance with an aspect of the present invention.

A thermal and hydraulic analysis was carried out for a section of fins representative of a heat exchanger core. The fins were oriented at an angle to the airflow so that the airflow was forced to turn upon entering and leaving the heat exchanger. Three cases were considered. A conventional heat exchanger such as depicted in FIGS. 1A-1C was analyzed for a baseline (Case 1). In a second case (Case 2), a heat exchanger with angled secondary fins extending from every primary fin was analyzed, while in a third case (Case 3), a heat exchanger with angled secondary fins extending from every other primary fin was analyzed. The fins were assumed to be 5 mm tall, and made of copper, while the flow velocity was assumed to be 3 m/s, and the temperature difference between the inlet air and the base of the fins was 25° C. FIG. 16 displays the results of the analysis, showing that the heat exchangers of Cases 2 & 3 yield a 22-44% increase in heat transfer, a 30-34% reduction in pumping power (via a pressure drop decrease), and an overall coefficient of performance (COP), defined as the ratio of heat transfer rate to pumping power consumed for cooling, superior to the conventional state of the art baseline Case 1 by a factor of approximately 2.0.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A method of fabricating a heat exchanger, the method comprising:
   obtaining a plurality of coolant-carrying conduit sections, each of the coolant-carrying conduit sections having a non-circular cross-section and comprising a first flat main surface and a second flat main surface;
   forming a plurality of primary folded fins and securing the plurality of primary folded fins to the plurality of coolant-carrying conduit sections, each of the primary folded fins being formed by bending a solid plate fin surface into a plate fin comprising a plurality of bends defining alternating, substantially U-shaped air-passage channels, and a base surface and a top surface, and each of the primary folded fins having at least one of the base surface and the top surface thereof secured to at least one flat main surface of at least one adjacent coolant-carrying conduit section of the plurality of coolant-carrying conduit sections, and the plurality of primary folded fins each having a leading edge and a trailing edge relative to an anticipated direction of airflow through the plurality of primary folded fins, the leading edge and the trailing edge of each of the primary folded fins being opposite edges of the primary folded fin and wherein the airflow through the plurality of primary folded fins is from the leading edges thereof, through the U-shaped air-passage channels and out from the trailing edges thereof;
   wherein the forming further includes forming a plurality of sets of secondary fins, each of the sets of secondary fins extending from one of the leading edge or the trailing edge of a respective primary folded fin of the plurality of primary folded fins, the forming the plurality of sets of secondary fins comprising angling each of the secondary fins extending from a respective primary folded fin at other than 0° to facilitate airflow through the heat exchanger, and wherein each of the primary folded fins and respective set of secondary fins is a substantially V-shaped structure in top plan view; and
   wherein at least one coolant-carrying conduit section of the plurality of coolant-carrying conduit sections has a first primary folded fin of the plurality of primary folded fins secured to the first flat main surface thereof, and a second primary folded fin of the plurality of primary folded fins secured to the second flat main surface thereof.

2. The method of claim 1, wherein at least the leading edges of the plurality of primary folded fins are disposed at an angle α with respect to a direction of airflow, wherein angle α≠0°, and wherein at least some secondary fins of the plurality of sets of secondary fins are formed to extend from the plurality of primary folded fins at an angle β to the plurality of primary folded fins, wherein β=α.

3. The method of claim 1, wherein one set of secondary fins comprises n secondary fins, and one primary folded fin comprises m primary fin sections extending between a first coolant-carrying conduit section and a second coolant-carrying conduit section of the plurality of coolant-carrying conduit sections, wherein n≦m, and wherein the n secondary fins are formed to one of:
   extend at the leading edge of the one primary folded fin from at most every other primary fin section of the m primary fin sections; or
   extend at the trailing edge of the one primary folded fin from at most every other primary fin section of the m primary fin sections.

4. The method of claim 1, wherein forming the plurality of sets of secondary fins comprises forming one of:
   a first plurality of sets of secondary fins extending from the leading edges of the plurality of primary folded fins at a first angle; or
   a second plurality of sets of secondary fins extending from the trailing edges of the plurality of primary folded fins at a second angle.

5. The method of claim 1, wherein the first flat main surface and the second flat main surface of each of the coolant-carrying conduit sections are parallel.

6. The method of claim 1, wherein heat is transferred between airflow passing between primary folded fins of the plurality of primary folded fins and coolant passing through the plurality of coolant-carrying conduit sections.

7. The method of claim 1, wherein a primary folded fin of the plurality of primary folded fins comprises a plurality of right angle bends defining the alternating U-shaped air-passage channels.

8. The method of claim 1, wherein the forming comprises securing the plurality of primary folded fins to the plurality of coolant-carrying conduit sections in an interleaved manner within a stack, wherein at least one primary folded fin of the plurality of primary folded fins has a first coolant-carrying conduit section of the plurality of coolant-carrying conduit sections secured to the base surface thereof, and a second coolant-carrying conduit section of the plurality of coolant-carrying conduit sections secured to the top surface thereof.

9. A method of fabricating a heat exchanger, the method comprising:

obtaining a plurality of coolant-carrying conduit sections, each of the coolant-carrying conduit sections having a non-circular cross-section and comprising a first flat main surface and a second flat main surface;

forming a plurality of primary folded fins and securing the plurality of folded fins to the plurality of coolant-carrying conduit sections, each of the primary folded fins being formed by bending a solid plate fin surface into a plate fin comprising a plurality of bends defining alternating, substantially U-shaped air-passage channels, and a base surface and a top surface, and each of the primary folded fins having at least one of the base surface and the top surface thereof secured to at least one flat main surface of at least one adjacent coolant-carrying conduit section of the plurality of coolant-carrying conduit sections, and the plurality of primary folded fins each having a leading edge and a trailing edge relative to an anticipated direction of airflow through the plurality of primary folded fins, the leading edge and the trailing edge of each of the primary folded fins being opposite edges of the primary folded fin and wherein airflow through the plurality of primary folded fins is from the leading edges thereof, through the U-shaped air-passage channels and out from the trailing edges thereof;

wherein the forming further includes forming a plurality of sets of secondary fins, each of the sets of secondary fins comprising secondary fins extending from the leading edge and secondary fins extending from the trailing edge of a respective primary folded fin of the plurality of primary folded fins, the forming the plurality of sets of secondary fins comprising angling each secondary fin extending from a respective primary folded fin at other than zero degrees to facilitate airflow through the heat exchanger, and wherein each primary folded fin and respective set of secondary fins is a substantially Z-shaped structure in top plan view; and wherein at least one coolant-carrying conduit section of the plurality of coolant-carrying conduit sections has a first primary folded fin of the plurality of primary folded fins secured to the first flat main surface thereof, and a second primary folded fin of the plurality of primary folded fins secured to the second flat main surface thereof.

10. The method of claim 9, wherein the forming further comprises forming a first plurality of sets of secondary fins extending from the leading edges of the plurality of primary folded fins at a first angle, and a second plurality of sets of folded fins extending from the trailing edges of the plurality of primary folded fins at a second angle.

11. The method of claim 10, wherein the forming further comprises forming the first plurality of sets of secondary fins and the second plurality of sets of secondary fins such that a respective set of secondary fins extends from the leading edge of one primary folded fin of the primary folded fins and from the trailing edge of the one primary folded fin.

12. The method of claim 9, wherein one set of secondary fins comprises n secondary fins, and one primary folded fin comprises m primary fin sections extending between a first coolant-carrying conduit section and a second coolant-carrying conduit section of the plurality of coolant-carrying conduit sections, wherein n≦m, and wherein the n secondary fins are formed to:

extend at the leading edge of the one primary folded fin from at most every other primary fin section of the m primary fin sections; and extend at the trailing edge of the one primary folded fin from at most every other primary fin section of the m primary fin sections.

13. The method of claim 9, wherein forming the plurality of sets of secondary fins comprises forming:

a first plurality of secondary fins extending from the leading edges of the plurality of primary folded fins at a first angle; and a second plurality of secondary fins extending from the trailing edges of the plurality of primary folded fins at a second angle.

14. An air-to-liquid heat exchanger comprising:

a plurality of coolant-carrying conduit sections, each of the coolant-carrying conduit sections having a non-circular cross-section and comprising a first flat main surface and a second flat main surface;

a plurality of primary folded fins secured to the plurality of coolant-carrying conduit sections, each of the primary folded fins being a solid plate fin surface with a plurality of bends defining alternating, substantially U-shaped, air-passage channels, and a base surface and a top surface, and each of the primary folded fins having at least one of the base surface and the top surface thereof secured to at least one flat main surface of at least one adjacent coolant-carrying conduit section of the plurality of coolant-carrying conduit sections, and the plurality of primary folded fins each having a leading edge and a trailing edge relative to an anticipated direction of airflow through the plurality of primary folded fins, the leading edge and the trailing edge of each of the primary folded fins being opposite edges of the primary folded fin, and wherein airflow through the plurality of primary folded fins is from the leading edges thereof, through the U-shaped air-passage channels and out from the trailing edges thereof;

a plurality of sets of secondary fins, each of the sets of secondary fins extending at an angle from at least one of the leading edge and the trailing edge of a respective primary folded fin of the plurality of primary folded fins, each of the secondary fins extending from a respective primary folded fin at other than zero degrees to facilitate airflow through the heat exchanger, and wherein each of the primary folded fins and respective set of secondary fins is a substantially V-shaped or a substantially Z-shaped structure in top plan view, wherein each of the primary folded fins and respective set of secondary fins is a substantially V-shaped structure in top plan view where the respective set of secondary fins extend from only one of the leading edge or the trailing edge of the primary folded fin, and is a substantially Z-shaped structure in top plan view where the respective set of secondary fins comprises secondary fins extending from the leading edge and secondary fins extending from the trailing edge of the primary folded fin; and wherein at least one coolant-carrying conduit section of the plurality of coolant-carrying conduit sections has a first primary folded fin of the plurality of primary folded fins secured to the first flat main surface thereof and a second primary folded fin of the plurality of folded fins secured to the second flat main surface thereof.

15. The air-to-liquid heat exchanger of claim 14, wherein at least the leading edges of the plurality of primary folded fins are disposed at an angle $\alpha$ with respect to a direction of airflow, wherein angle $\alpha \neq 0°$, and wherein at least some secondary fins of the plurality of sets of secondary fins are formed to extend from the plurality of primary folded fins at an angle $\beta$ to the plurality of primary folded fins, wherein $\beta=\alpha$.

16. The air-to-liquid heat exchanger of claim 14, wherein one set of secondary fins comprises n secondary fins, and one primary folded fin comprises m primary fin sections extending between a first coolant-carrying conduit section and a second coolant-carrying conduit section of the plurality of coolant-carrying conduit sections, wherein $n \leq m$, and wherein the n secondary fins are formed to at least one of:
- extend at the leading edge of the one primary folded fin from at most every other primary fin section of the m primary fin sections; and
- extend at the trailing edge of the one primary folded fin from at most every other primary fin section of the m primary fin sections.

17. The air-to-liquid heat exchanger of claim 14, wherein the plurality of sets of secondary fins comprise at least one of:
- a first plurality of sets of secondary fins extending from the leading edges of the plurality of primary folded fins at a first angle; and
- a second plurality of sets of secondary fins extending from the trailing edges of the plurality of primary folded fins at a second angle.

18. The air-to-liquid heat exchanger of claim 14, wherein the first flat main surface and the second flat main surface of each coolant-carrying conduit section are parallel.

19. The air-to-liquid heat exchanger of claim 14, wherein a primary folded fin of the plurality of primary folded fins comprises a plurality of right angle bends defining the alternating U-shaped air-passage channels.

20. The air-to-liquid heat exchanger of claim 14, wherein the plurality of primary folded fins are secured to the plurality of coolant-carrying conduit sections in an interleaved manner within a stack, wherein at least one primary folded fin of the plurality of primary folded fins has a first coolant-carrying conduit section of the plurality of coolant-carrying conduit sections secured to the base surface thereof, and a second coolant-carrying conduit section of the plurality of coolant-carrying conduit sections secured to the top surface thereof.

* * * * *